United States Patent
Ota et al.

(10) Patent No.: US 11,936,162 B2
(45) Date of Patent: Mar. 19, 2024

(54) LIGHT SOURCE DEVICE AND OPTICAL PULSE TESTER

(71) Applicants: YOKOGAWA ELECTRIC CORPORATION, Musashino (JP); YOKOGAWA TEST & MEASUREMENT CORPORATION, Hachioji (JP)

(72) Inventors: Katsushi Ota, Musashino (JP); Tsukasa Kokubo, Hachioji (JP)

(73) Assignees: YOKOGAWA ELECTRIC CORPORATION, Tokyo (JP); YOKOGAWA TEST & MEASUREMENT CORPORATION, Tokyo (JP)

( * ) Notice: Subject to any disclaimer, the term of this patent is extended or adjusted under 35 U.S.C. 154(b) by 391 days.

(21) Appl. No.: 17/370,304

(22) Filed: Jul. 8, 2021

(65) Prior Publication Data
US 2022/0021184 A1    Jan. 20, 2022

(30) Foreign Application Priority Data

Jul. 15, 2020 (JP) .................................. 2020-121625

(51) Int. Cl.
*H01S 5/14* (2006.01)
*H01S 5/028* (2006.01)

(52) U.S. Cl.
CPC ............ *H01S 5/146* (2013.01); *H01S 5/0287* (2013.01)

(58) Field of Classification Search
CPC ............................... H01S 5/146; H01S 5/0287
See application file for complete search history.

(56) References Cited

U.S. PATENT DOCUMENTS

| 5,181,213 | A | * | 1/1993 | Shinokura | ............... H01S 5/146 385/38 |
| 5,771,250 | A | * | 6/1998 | Shigehara | ............ H04B 10/071 385/12 |
| 6,091,744 | A | * | 7/2000 | Sorin | ....................... H01S 5/141 372/19 |
| 2008/0252066 | A1 | * | 10/2008 | Rapoport | ........... G06K 19/0614 101/211 |

FOREIGN PATENT DOCUMENTS

| JP | H09-184788 | A | | 7/1997 |
| JP | 2002-141609 | A | | 5/2002 |
| JP | 2007085754 | A | * | 4/2007 |
| JP | 2007285765 | A | * | 11/2007 |
| JP | 2018-13346 | A | | 1/2018 |
| JP | 2019-029428 | A | | 2/2019 |

* cited by examiner

*Primary Examiner* — Michael A Lyons
*Assistant Examiner* — Omar H Nixon
(74) *Attorney, Agent, or Firm* — WHDA, LLP

(57) ABSTRACT

A light source device includes a semiconductor laser that has a first end surface and a second end surface parallel to each other and forming a first resonator, and an optical system that is disposed on an optical path of laser light emitted from the semiconductor laser, that forms a second resonator with the second end surface of the semiconductor laser, and that has a reflection characteristic in which a reflectance with respect to light having a previously specified wavelength width centered at a specified center wavelength of the semiconductor laser is higher than the reflectance of the first end surface.

10 Claims, 6 Drawing Sheets

LIGHT SOURCE DEVICE AND OPTICAL PULSE TESTER

TECHNICAL FIELD

The present disclosure relates to a light source device and an optical pulse tester.

BACKGROUND

An optical pulse tester is a device that causes an optical pulse to be incident on an optical fiber that is to be tested and tests or measures a characteristic of the optical fiber on the basis of return light obtained from the optical fiber. There are optical pulse testers called, for example, an OTDR (Optical Time Domain Reflectometer), a BOTDR (Brillouin Optical Time Domain Reflectometer), and a ROTDR (Raman Optical Time Domain Reflectometer).

The OTDR is a device that measures a transmission loss of an optical fiber, a distance to a failure point, and the like on the basis of Rayleigh scattered light and Fresnel reflected light generated in the optical fiber. The BOTDR is a device that measures distortion, temperature distribution, and the like in an optical fiber on the basis of backscattered light of Brillouin scattering generated in the optical fiber. The ROTDR is a device that measures temperature distribution and the like in an optical fiber on the basis of backscattered light of Raman scattering generated in the optical fiber.

Japanese Unexamined Patent Application Publication No. 2018-13346 discloses an optical pulse tester of related art capable of outputting an optical pulse and continuous light (or modulated light) having high stability from one semiconductor laser. In addition, Japanese Unexamined Patent Application Publication No. 2002-141609 discloses a semiconductor laser module in which a wavelength selection filter is provided in a cavity formed by a reflection film that is formed on the front end surface (or the rear end surface) of a semiconductor laser element and an exposed surface of an incident end surface of an optical fiber (or a reflection film formed on an incident end surface).

SUMMARY

The above-described optical pulse tester generally uses a Fabry-Perot semiconductor laser. This is because the Fabry-Perot semiconductor laser is comparatively inexpensive and capable of obtaining a high output. The Fabry-Perot semiconductor laser, however, has a variation in center wavelength between individuals and has a center wavelength that changes due to a temperature change. The Fabry-Perot semiconductor laser thus has a problem that it is difficult to keep the center wavelength within a previously specified range (for example, within 15 nm of a specified value) if temperature control is not performed on a selected individual.

The present application has been made in consideration of the aforementioned circumstances, and one of embodiments provides a light source device capable of easily keeping the center wavelength within a predetermined range, and an optical pulse tester including the light source device.

To address the aforementioned circumstances, a light source device (21, 21B, 21C, 22) according to one aspect of the present disclosure includes a semiconductor laser (LD) that has a first end surface (E1) and a second end surface (E2) parallel to each other and forming a first resonator and that is configured to emit laser light from the first end surface; and an optical system (21c, 21e, 21f, 21h) that is disposed on an optical path of the laser light emitted from the semiconductor laser, that forms a second resonator (RS2) with the second end surface of the semiconductor laser, and that has a reflection characteristic in which a reflectance with respect to light of a previously specified wavelength width centered at a specified center wavelength of the semiconductor laser is higher than a reflectance of the first end surface.

In a light source device according to one aspect of the present disclosure, the optical system includes an optical element (21c) that has a first surface (PL1) at which a reflection film having the reflection characteristic is provided and a second surface (PL2) at which an anti-reflection film with respect to the laser light emitted from the semiconductor laser is provided.

Alternatively, in a light source device according to one aspect of the present disclosure, the optical system includes a first optical element (21e) disposed obliquely with respect to the optical path of the laser light and having a transmission characteristic in which only light of the prespecified wavelength width centered at the specified center wavelength of the semiconductor laser is transmitted, and a second optical element (21f) that reflects and transmits the laser light transmitted through the first optical element at a previously specified ratio.

A light source device according to one aspect of the present disclosure includes a collimator optical system (21b) that is disposed on the optical path of the laser light between the semiconductor laser and the optical system and that collimates the laser light emitted from the semiconductor laser.

Alternatively, in a light source device according to one aspect of the present disclosure, the optical system includes a reflection member (21h) at which a grating (GR) having the reflection characteristic is formed, and a condenser optical system (21g) that is provided on the optical path of the laser light between the semiconductor laser and the reflection member and that condenses the laser light emitted from the semiconductor laser on the reflection member is included.

An optical pulse tester according to one aspect of the present disclosure is an optical pulse tester (1) configured to test a characteristic of an optical fiber (FUT) based on return light obtained by causing an optical pulse to be incident on the optical fiber. The optical pulse tester includes: a bidirectional module (11) including any one of the aforementioned light source devices configured to emit the optical pulse and a light receiving device (26) configured to receive the return light; and a signal processing unit (14) configured to perform a processing that obtains the characteristic of the optical fiber based on a light reception result of the light receiving device.

According to the one of embodiments, there is an effect that it is possible to keep a center wavelength within a predetermined range easily. In the above explanation of the exemplary embodiments, specific elements with their reference numerals are indicated by using brackets. These specific elements are presented as mere examples in order to facilitate understanding, and thus, should not be interpreted as any limitation to the accompanying claims.

DESCRIPTION OF THE PREFERRED EMBODIMENTS

Figure 1:
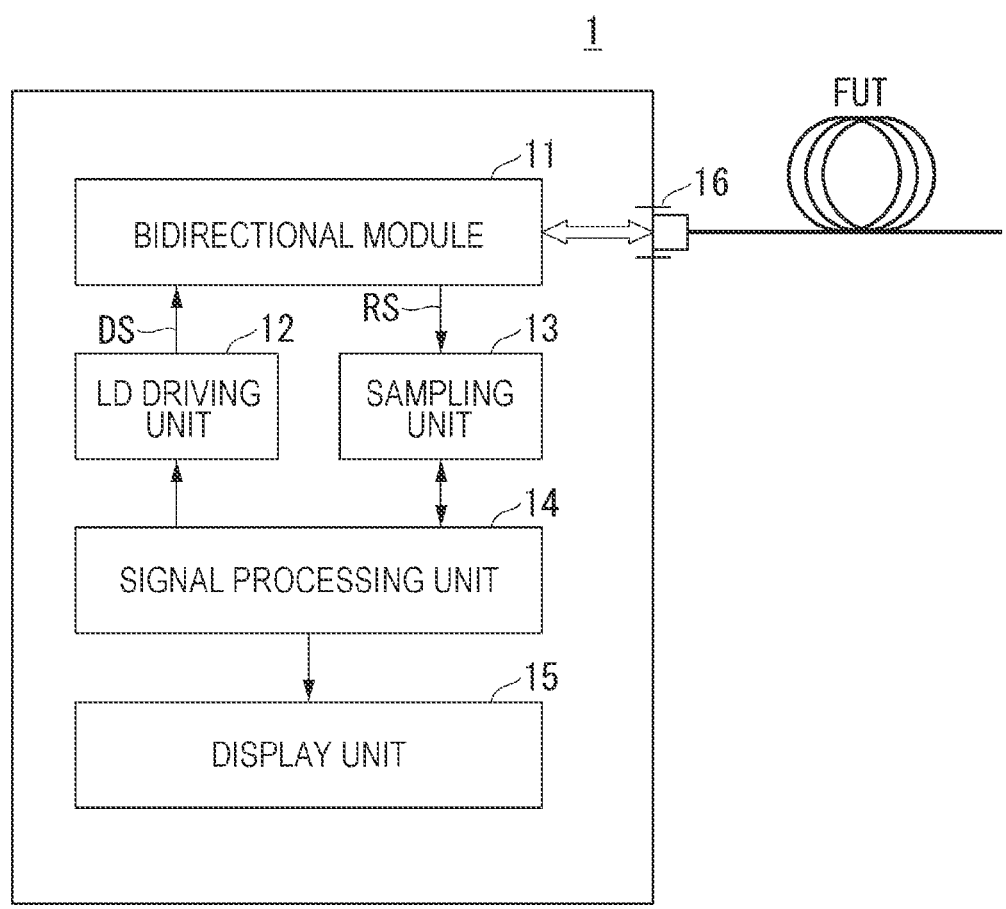
FIG. 1 is a block diagram illustrating a main part configuration of an optical pulse tester according to a first embodiment of the present disclosure.

Hereinafter, a light source device and an optical pulse tester according to embodiments of the present disclosure will be described in detail with reference to the drawings. First, an overview of embodiments of the present disclosure will be described, and then, details of the embodiments of the present disclosure will be described.

Overview

In embodiments of the present disclosure, it is enabled to easily keep a center wavelength of a light source device within a predetermined range. The center wavelength of a light source device used in an optical pulse tester (OTDR) is specified to be within 15 nm of a specified value (for example, 1310 nm or 1550 nm) in the Japanese Industrial Standards (JIS C 6823). A Fabry-Perot semiconductor laser commonly used in an optical pulse tester has a variation in center wavelength between individuals. Thus, keeping the center wavelength of a light source device within the aforementioned range specified in the Japanese Industrial Standards requires selecting an individual whose center wavelength is close to a prescribed value, resulting in a cost increase.

The center wavelength of the Fabry-Perot semiconductor laser also changes due to a temperature change. For example, a wavelength shift of about 0.4 nm/° C. occurs with a temperature change. Therefore, keeping the center wavelength of a light source device within the aforementioned range specified in the Japanese Industrial Standards requires, for example, mounting a Peltier element or the like on the light source device and performing temperature control of the light source device strictly. The OTDR is mostly used outdoors, such as a construction site, and thus is battery-driven in general. In an environment in which a temperature change is large, the power consumption of the Peltier element increases, and the driving time of the battery is extremely shortened.

Here, a DFB (Distributed Feed-Back) semiconductor laser has a characteristic such that a variation in center wavelength between individuals is small, and a wavelength shift due to a temperature change is about 0.1 nm/° C. and is very small compared with a Fabry-Perot semiconductor laser. It is thus also considered that it is possible to keep the center wavelength of a light source device within the aforementioned range specified in the Japanese Industrial Standards easily by using a DFB semiconductor laser, instead of a Fabry-Perot semiconductor laser. The DFB semiconductor laser is, however, not able to realize a high dynamic range due to a small light output, and fading noise (phase noise) is generated and degrades the OTDR waveform due to a small spectrum half-value width.

In an embodiment of the present disclosure, an optical system having a reflection characteristic in which a reflectance with respect to light in a previously specified wavelength width centered at a specified center wavelength of a semiconductor laser is higher than the reflectance of a first end surface of the semiconductor laser is disposed on an optical path of a laser emitted from the first end surface of the semiconductor laser, and a second end surface of the semiconductor laser and the optical system form a resonator. This makes it possible to keep the center wavelength of the light source device within a predetermined range easily.

First Embodiment

Optical Pulse Tester

FIG. 1 is a block diagram illustrating a main part configuration of an optical pulse tester according to a first embodiment of the present disclosure. As illustrated in FIG. 1, an optical pulse tester 1 according to the present embodiment includes a bidirectional module 11, an LD driving unit 12, a sampling unit 13, a signal processing unit 14, a display unit 15, and a connector 16. Such an optical pulse tester 1 tests or measures a characteristic of an optical fiber FUT on the basis of return light obtained by causing an optical pulse to be incident on the optical fiber FUT. The optical pulse tester 1 is also called an OTDR.

The bidirectional module 11 outputs an optical pulse (laser beam) caused to be incident on the optical fiber FUT on the basis of a driving signal DS output from the LD driving unit 12 and outputs a light reception signal RS upon receiving return light obtained from the optical fiber FUT. Details of the bidirectional module 11 will be described later.

Under the control of the signal processing unit 14, the LD driving unit 12 outputs the driving signal DS that drives the bidirectional module 11. In other words, the LD driving unit 12 outputs the driving signal DS for causing the bidirectional module 11 to output an optical pulse caused to be incident on the optical fiber FUT. Under the control of the signal processing unit 14, the sampling unit 13 samples the light reception signal RS output from the bidirectional module 11.

The signal processing unit 14 controls the LD driving unit 12 and the sampling unit 13 and performs an arithmetic operation required for obtaining a characteristic of the optical fiber FUT by using the signal that has been sampled by the sampling unit 13. The display unit 15 includes, for example, a display device, such as a liquid crystal display device and the like, and displays a result of the arithmetic operation of the signal processing unit 14 and the like. The connector 16 is for connecting one end of the optical fiber FUT to the optical pulse tester 1.

Bidirectional Module

Figure 2:
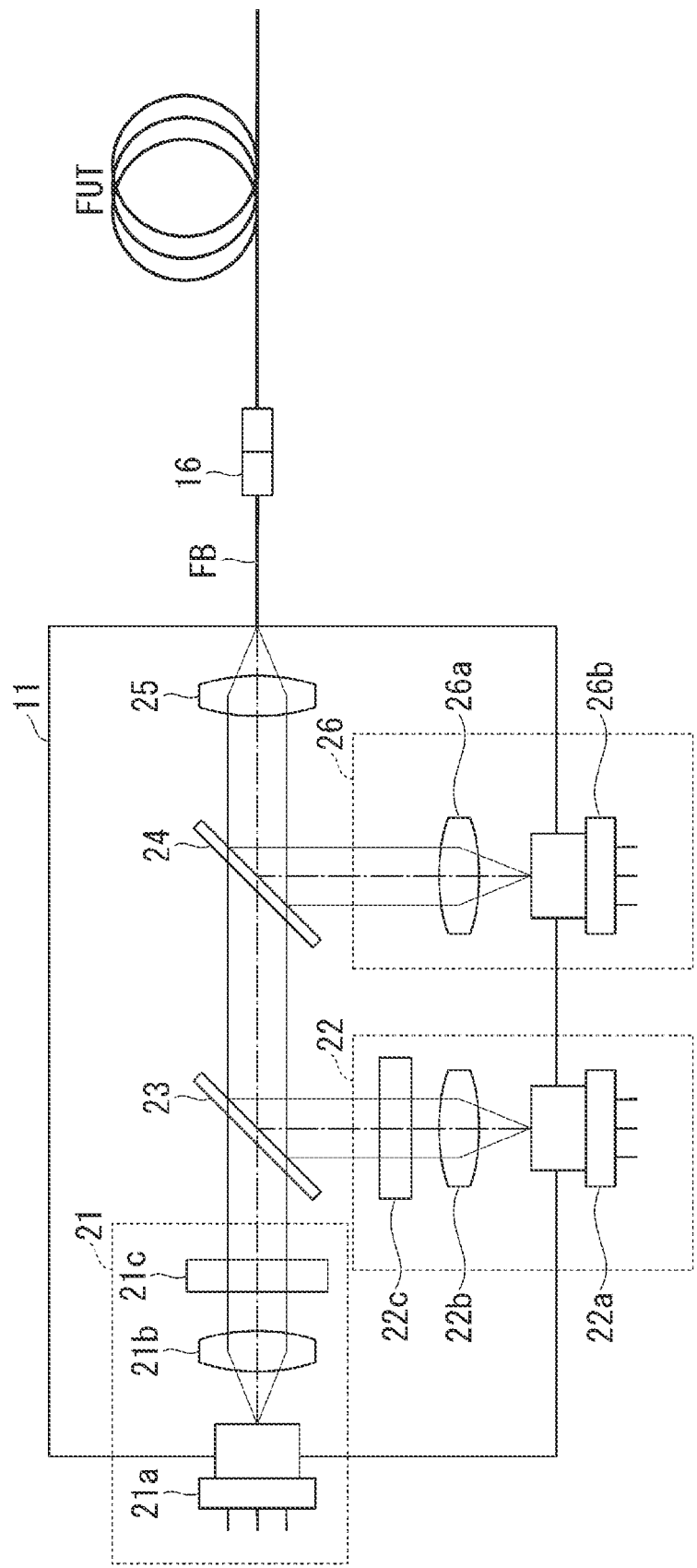
FIG. 2 is a diagram illustrating a main part configuration of a bidirectional module according to the first embodiment of the present disclosure.

FIG. 2 is a diagram illustrating a main part configuration of a bidirectional module according to the first embodiment of the present disclosure. As illustrated in FIG. 2, the bidirectional module 11 according to the present embodiment includes light source devices 21 and 22, a multiplexing-demultiplexing filter 23, a beam splitter 24, a lens 25, and a light receiving device 26. Such a bidirectional module 11 is capable of outputting an optical pulse having a center wavelength specified in the Japanese Industrial Standards (JIS C 6823). For example, the bidirectional module 11 is capable of outputting an optical pulse (hereinafter sometimes referred to as the "first optical pulse") having a center wavelength within ±15 nm centered at 1550 nm and an optical pulse (hereinafter sometimes referred to as the "second optical pulse") having a center wavelength within ±15 nm centered at 1310 nm.

The light source device 21 includes a pulse light source 21a, a collimator lens 21b (collimator optical system), and a notch filter 21c (optical system, optical element) and outputs the first optical pulse on the basis of the driving signal DS output from the LD driving unit 12. The light source device 22 includes a pulse light source 22a, a collimator lens 22b (collimator optical system), and a notch filter 22c (optical system, optical element) and outputs the second optical pulse on the basis of the driving signal DS output from the LD driving unit 12. Details of the light source devices 21 and 22 will be described later.

The multiplexing-demultiplexing filter 23 multiplexes the first optical pulse output from the light source device 21 and the second optical pulse output from the light source device 22. Here, if the light source devices 21 and 22 are driven at the same time, the first optical pulse and the second optical pulse are multiplexed by the multiplexing-demultiplexing filter 23. If one of the light source devices 21 and 22 is driven, one of the first optical pulse and the second optical pulse is guided to the beam splitter 24 via the multiplexing-demultiplexing filter 23.

The beam splitter 24 splits the incident light at a predetermined splitting ratio (for example 1:1). For example, the beam splitter 24 transmits 50% of the first optical pulse or the second optical pulse guided from the multiplexing-demultiplexing filter 23 and reflects the remaining 50%. The beam splitter 24 also reflects 50% of return light obtained from the optical fiber FUT and transmits the remaining 50%. The lens 25 couples the first optical pulse or the second optical pulse that has been transmitted through the beam splitter 24 to one end of a coupling optical fiber FB. The coupling optical fiber FB is connected at one end to the bidirectional module 11 and optically coupled to the lens 25 and is connected at the other end to the connector 16. In other words, one end of the optical fiber FUT is connected to the other end of the coupling optical fiber FB.

The light receiving device 26 includes a lens 26a and a photodetector 26b and outputs the light reception signal RS upon receiving return light reflected by the beam splitter 24. The lens 26a condenses the return light reflected by the beam splitter 24 on the photodetector 26b. The photodetector 26b includes, for example, a light receiving element, such as an avalanche photo diode (APD) or the like. The photodetector 26b photoelectrically coverts the return light incident on a light reception surface of the light receiving element and outputs the light reception signal RS corresponding to the return light incident on the light reception surface.

Light Source Device

Figure 3:
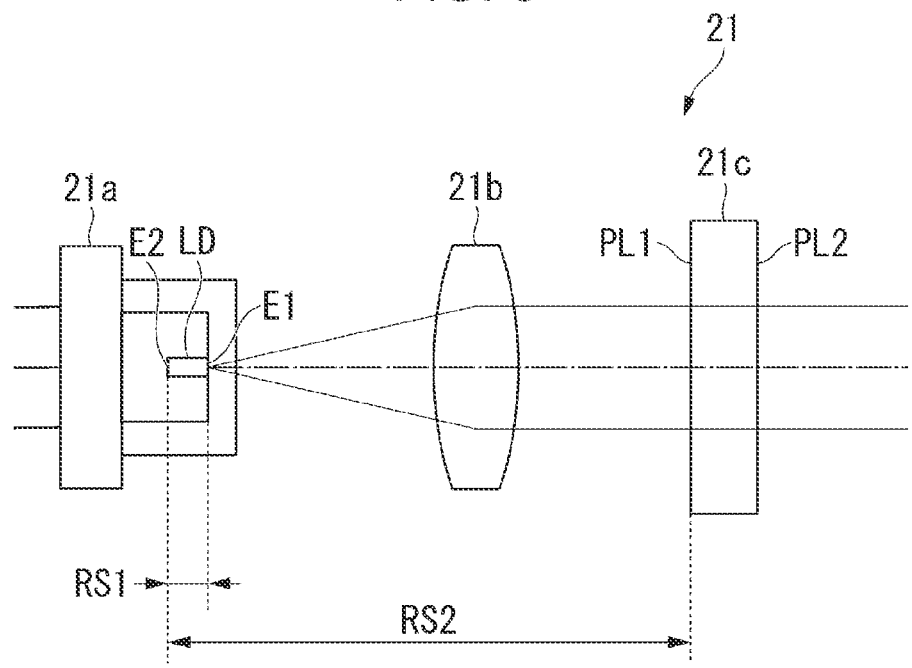
FIG. 3 is a diagram illustrating a main part configuration of a light source device according to the first embodiment of the present disclosure.

FIG. 3 is a diagram illustrating a main part configuration of a light source device according to the first embodiment of the present disclosure. As illustrated in FIG. 3, the light source device 21 has a configuration in which the collimator lens 21b and the notch filter 21c are disposed in this order on an optical path of an optical pulse emitted from the pulse light source 21a. In FIG. 3, the light source device 21 is illustrated. The light source device 22 has the same configuration. That is, the light source device 21, the pulse light source 21a, the collimator lens 21b, and the notch filter 21c illustrated in FIG. 3 should be read as the light source device 22, the pulse light source 22a, the collimator lens 22b, and the notch filter 22c, respectively, for the configuration of the light source device 22. Note that the center wavelength of the light source device 22 is 1310 nm.

As illustrated in FIG. 3, the pulse light source 21a includes a semiconductor laser LD. The semiconductor laser LD is, for example, a Fabry-Perot semiconductor laser having a first end surface E1 and a second end surface E2 parallel to each other. On the first end surface E1 of the semiconductor laser LD, for example, an AR coat (Anti-Reflection coating: antireflection film) whose reflectance with respect to the first optical pulse is about 5% or less is formed. On the second end surface E2 of the semiconductor laser LD, for example, a HR coat (High Reflection coating: reflection enhancing film) whose reflectance with respect to the first optical pulse is about 90% or less is formed.

When receiving the driving signal DS output from the LD driving unit 12 illustrated in FIG. 1, the semiconductor laser LD emits an optical pulse having a center wavelength of approximately 1550 nm from the first end surface E1. Here, due to having a variation in center wavelength between individuals and having a center wavelength that also changes due to a temperature change, the Fabry-Perot semiconductor laser is considered to "emit an optical pulse whose center wavelength is approximately 1550 nm".

The collimator lens 21b is provided on the optical path of the optical pulse between the pulse light source 21a and the notch filter 21c and collimates the optical pulse output from the pulse light source 21a into parallel light. The notch filter 21c is an optical element that forms a resonator with the second end surface E2 of the semiconductor laser LD and is provided to keep the center wavelength of the light source device 21 within a predetermined range (range of ±15 nm centered at 1550 nm).

Figure 4:
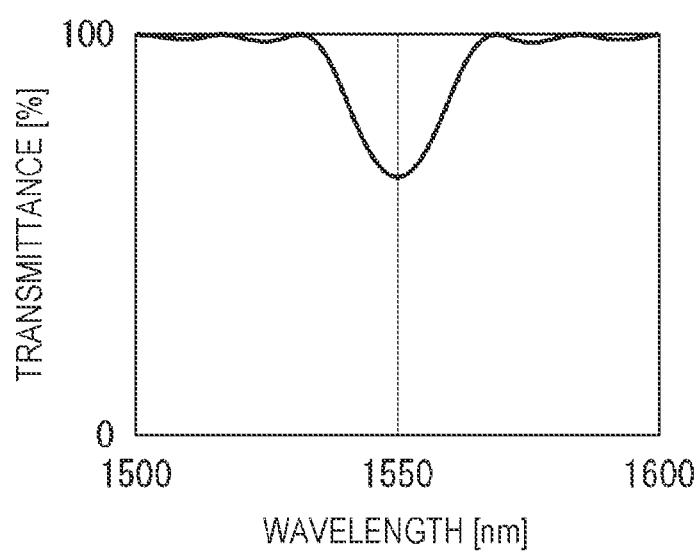
FIG. 4 is a graph showing an example of reflection/transmission characteristics of a notch filter used in the first embodiment of the present disclosure.

The notch filter 21c is a parallel flat plate-shaped glass member having a first surface PL1 on which a reflection film having the reflection characteristic indicated in FIG. 4 is formed, and a second surface PL2 on which the AR coat is formed. The notch filter 21c is formed by, for example, a glass material, such as BK7, B270, or the like. Thus, using the notch filter 21c formed by a glass material is for reducing temperature dependence of the reflection wavelength.

FIG. 4 is a graph showing an example of reflection/transmission characteristics of a notch filter used in the first embodiment of the present disclosure. In the graph in FIG. 4, the horizontal axis indicates wavelength, and the vertical axis indicates transmittance. When the transmittance is denoted by T [%], a reflectance R is represented by a relational expression R=100−T [%]. While the graph in FIG. 4 shows a transmission characteristic of the notch filter 21c directly due to having the vertical axis indicating transmittance, the graph in FIG. 4 also shows a reflection characteristic of the notch filter 21c indirectly due to the aforementioned relational expression.

As shown in FIG. 4, the transmittance of the notch filter 21c is lowest, for example, about 70% with a specified center wavelength (1550 nm) of the semiconductor laser LD. In other words, the reflectance of the notch filter 21c is highest, for example, about 30% with the specified center wavelength (1550 nm) of the semiconductor laser LD. The transmittance of the notch filter 21c gradually increases as the transmittance becomes away from the specified center wavelength (1550 nm) of the semiconductor laser LD. In other words, the reflectance of the notch filter 21c gradually decreases as the reflectance becomes away from the specified center wavelength (1550 nm) of the semiconductor laser LD.

In the example shown in FIG. 4, the wavelength width (full width at half maximum: FWHM) (previously specified wavelength width) of a part at which the reflectance is half the reflectance at the center wavelength is about 10 nm. This wavelength width may be 15 nm, which is specified as an error of the center wavelength in the Japanese Industrial Standards (JIS C 6823). The notch filter 21c has a reflection characteristic in which at least the reflectance with respect to light of this wavelength width is higher than the reflectance of the first end surface E1 of the semiconductor laser LD. The reflectance of the reflection film formed on the first surface PL1 of the notch filter 21c is at least higher than the reflectance of the first end surface E1 of the semiconductor laser LD. It is desirable that the reflectance be, for example, about 20 to 70%.

As illustrated in FIG. 3, in the present embodiment, the first end surface E1 and the second end surface E2 of the semiconductor laser LD form a first resonator RS1, and the second end surface E2 of the semiconductor laser LD and the reflection film formed on the first surface PL1 of the notch filter 21c form a second resonator RS2. That is, a complex resonator constituted by the first resonator RS1 and the second resonator RS2 is formed in the light source device 21.

Here, as described above, the reflectance of the notch filter 21c is higher than the reflectance of the first end surface E1 of the semiconductor laser LD. Therefore, the main oscillation mode (longitudinal mode) of the semiconductor laser LD is determined by the second resonator RS2 formed by the second end surface E2 of the semiconductor laser LD and the reflection film formed on the first surface PL1 of the notch filter 21c.

As described above, the notch filter 21c is formed by a glass material, and thus, the temperature dependence of the reflection wavelength is smaller (for example, smaller by about one order of magnitude) than that of the semiconductor laser LD. Thus, even when an environmental temperature changes, the change in the center wavelength of a pulsed light output from the light source device 21 can be significantly reduced. Consequently, it is possible to keep the center wavelength of the optical pulse output from the light source device 21 within a predetermined range (range of ±15 nm centered at 1550 nm).

Operation of Optical Pulse Tester

When an operation of the optical pulse tester 1 is started, the LD driving unit 12 is first controlled by the signal processing unit 14 illustrated in FIG. 1, and the driving signal DS is output from the LD driving unit 12. The driving signal DS output from the LD driving unit 12 is supplied to, for example, the light source device 21 (refer to FIG. 2) of the bidirectional module 11. When the driving signal DS is supplied to the light source device 21, laser oscillation occurs in the semiconductor laser LD (the semiconductor laser LD at which the resonator RS1 is formed as illustrated in FIG. 3) provided at the pulse light source 21a, and an optical pulse (laser light) is emitted from the first end surface E1 of the semiconductor laser LD.

The optical pulse emitted from the first end surface E1 of the semiconductor laser LD is converted at the collimator lens 21b into parallel light and then is incident on the notch filter 21c. A portion of the optical pulse is reflected by the reflection film formed on the first surface PL1 of the notch filter 21c, and the rest is transmitted through the notch filter 21c. The parallel light reflected by the notch filter 21c is condensed by the collimator lens 21b and is incident on the semiconductor laser LD from the first end surface E1. The optical pulse incident on the semiconductor laser LD is reflected by the second end surface E2 of the semiconductor laser LD, and then, a portion of the optical pulse is emitted again from the first and surface E1 of the semiconductor laser LD.

The optical pulse emitted from the first end surface E1 of the semiconductor laser LD is converted at the collimator lens 21b into parallel light and then is incident on the notch filter 21c. A portion of the optical pulse is reflected by the reflection film formed on the first surface PL1 of the notch filter 21c, and the rest is transmitted through the notch filter 21c. The optical pulse thus reciprocates in the second resonator RS2 formed by the second end surface E2 of the semiconductor laser LD and the reflection film formed on the first surface PL1 of the notch filter 21c. Consequently, the main oscillation mode (longitudinal mode) of the semiconductor laser LD is determined by the second resonator RS2, and the light source device 21 outputs the first optical pulse (optical pulse having a center wavelength within ±15 nm centered at 1550 nm).

After passing through the multiplexing-demultiplexing filter 23 and the beam splitter 24 in this order, the first optical pulse output from the light source device 21 is incident on the optical fiber FUT connected to the connector 16. With the first optical pulse propagating through the optical fiber FUT, Rayleigh scattering light and Fresnel reflection light are generated in the optical fiber FUT. The light propagates as return light in the opposite direction (direction opposite to the propagation direction of the first optical pulse) in the optical fiber FUT.

The return light output from the optical fiber FUT is received by the light receiving device 26 provided at the bidirectional module 11, and the light receiving device 26 outputs the light reception signal RS. The light reception signal RS is sampled at the sampling unit 13 illustrated in FIG. 1. The signal sampled at the sampling unit 13 is input into the signal processing unit 14 and used in an arithmetic operation required for obtaining a characteristic of the optical fiber FUT. In the signal processing unit 14, for example, an arithmetic operation that obtains a distance from the optical pulse tester 1 to a failure point of the optical fiber FUT is performed on the basis of, for example, a time from when the first optical pulse is output from the light source device 21 to when the return light is received by the light receiving device 26. The thus obtained result (for example, a transmission loss of the optical fiber FUT, a distance to a failure point, and the like) of the arithmetic operation of the signal processing unit 14 is displayed on the display unit 15.

As described above, in the present embodiment, the notch filter 21c having a reflection characteristic in which a reflectance with respect to light of a previously specified wavelength width (for example, ±15 nm) centered at a specified center wavelength (for example, 1550 nm) of the semiconductor laser LD is higher than the reflectance of the first end surface E1 of the semiconductor laser LD is disposed on the optical path of the optical pulse (laser light) emitted from the first end surface E1 of the semiconductor laser LD. The second end surface E2 of the semiconductor laser LD and the notch filter 21c form the second resonator RS2. Consequently, the main oscillation mode (longitudinal mode) of the semiconductor laser LD is determined by the second resonator RS2, and it is thus possible to keep the center wavelength of the light source device 21 within a predetermined range easily.

In the present embodiment, since the semiconductor laser LD at which the first resonator RS1 is formed also oscillates laser, the spectral width is not extremely narrowed, and there is no influence of waveform noise due to the influence of fading noise. When a distance (external resonator length) between the semiconductor laser LD and the notch filter 21c is extremely long, no laser may be oscillated due to lack of gain if the pulse width of an optical pulse is narrow. In contrast, in the present embodiment, since the notch filter 21c can be disposed immediately after the collimator lens 21b, it is possible to oscillate laser sufficiently, even when the pulse width of an optical pulse is narrow. Moreover, the present embodiment does not use a temperature control device, such as a Peltier element and the like, to keep the center wavelength of the light source device 21 within a predetermined range. Therefore, even when the optical pulse tester 1 is used outdoors, the driving time of the battery is not shortened.

Second Embodiment

Optical Pulse Tester, Bidirectional Module

A main part configuration of an optical pulse tester according to the present embodiment is the same as the main part configuration of the optical pulse tester 1 illustrated in FIG. 1. A main part configuration of a bidirectional module included in the optical pulse tester according to the present embodiment is a configuration in which the light source devices 21 and 22 of the bidirectional module 11 illustrated in FIG. 2 are replaced with that illustrated in FIG. 5. Description of the configurations of the optical pulse tester and the bidirectional module according to the present embodiment is thus omitted.

Light Source Device

Figure 5:
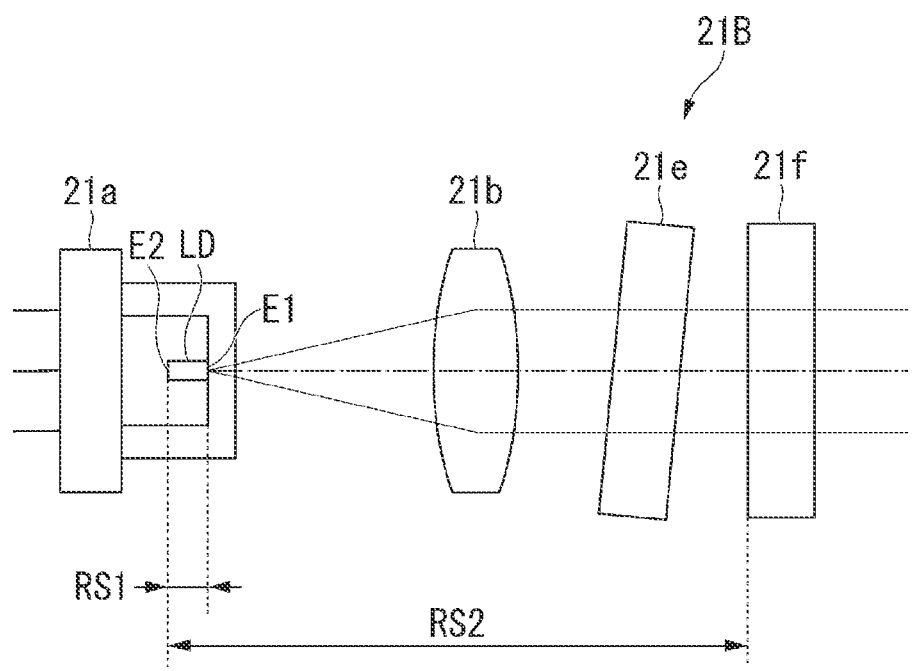
FIG. 5 is a diagram illustrating a main part configuration of a light source device according to a second embodiment of the present disclosure.

FIG. 5 is a diagram illustrating a main part configuration of a light source device according to the second embodiment of the present disclosure. In FIG. 5, a light source device 21B provided instead of the light source device 21 illustrated in FIG. 3 is illustrated. A light source device 22B (not illustrated) provided instead of the light source device 22 illustrated in FIG. 3 has the same configuration. Note that the center wavelength of the light source device 22B is 1310 nm.

As illustrated in FIG. 5, the light source device 21B according to the present embodiment differs from the light source device 21 illustrated in FIG. 3 in that, instead of the notch filter 21c illustrated in FIG. 3, a bandpass filter 21e (optical system, first optical element) and a half mirror 21f (optical system, second optical element) are included. That is, the light source device 21B according to the present embodiment has a configuration in which the collimator lens 21b, the bandpass filter 21e, and the half mirror 21f are disposed in this order on the optical path of the optical pulse emitted from the pulse light source 21a.

As illustrated in FIG. 5, the bandpass filter 21e is disposed to be inclined with respect to the optical path of the optical pulse emitted from the pulse light source 21a. This is to suppress the optical pulse reflected by the bandpass filter 21e from being incident on the semiconductor laser LD. In other words, this is to suppress the second end surface E2 of the semiconductor laser LD and the bandpass filter 21e from forming a resonator. An inclination angle of the bandpass filter 21e with respect to the optical path of the optical pulse emitted from the pulse light source 21a is, for example, 5°. In the light source device 21B according to the present embodiment, the first end surface E1 and the second end surface E2 of the semiconductor laser LD form the first resonator RS1, and the second end surface E2 of the semiconductor laser LD and the half mirror 21f form the second resonator RS2.

Figure 6A:
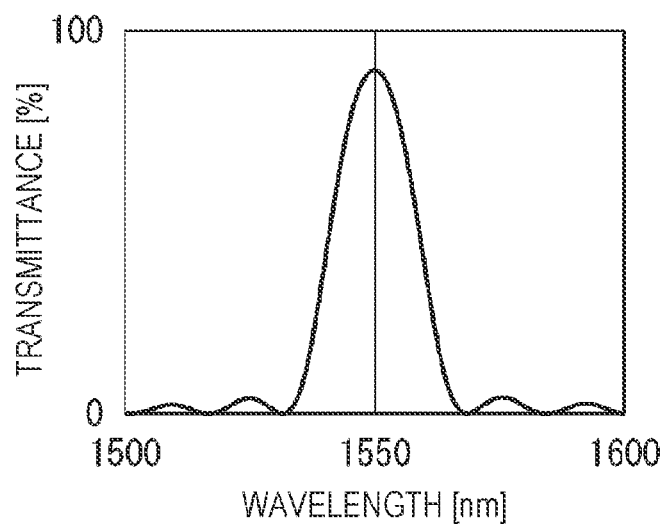
FIG. 6A and FIG. 6B are graphs showing examples of reflection/transmission characteristics of a bandpass filter and a half mirror used in the second embodiment of the present disclosure.
Figure 6B:
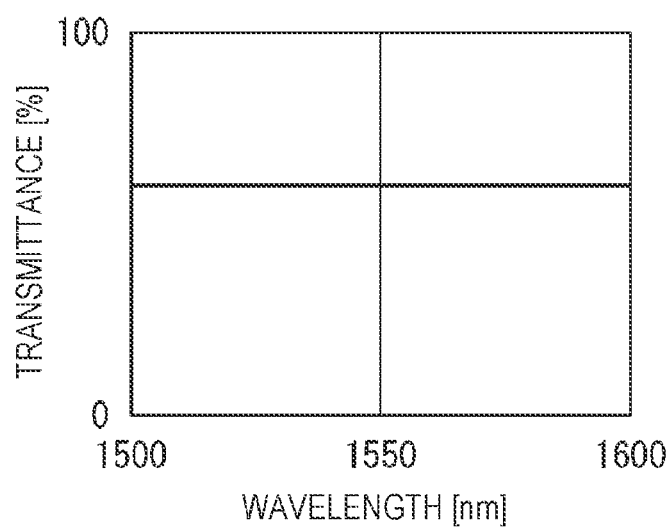

FIG. 6A and FIG. 6B are graphs showing examples of reflection/transmission characteristics of a bandpass filter and a half mirror used in the second embodiment of the present disclosure. FIG. 6A is a graph showing an example of reflection/transmission characteristics of the bandpass filter, and FIG. 6B is a graph showing an example of reflection/transmission characteristics of the half mirror. In the graph in FIG. 6, the horizontal axis indicates wavelength, and the vertical axis indicates transmittance, as with the graph in FIG. 4.

As shown in FIG. 6A, the bandpass filter 21e has a transmission characteristic in which only light of a predetermined wavelength width centered at a specified center wavelength (1550 nm) of the semiconductor laser LD is transmitted. For example, the wavelength width (full width at half maximum: FWHM) (previously specified wavelength width) with which the bandpass filter 21e transmits light is about 10 to 15 nm. The transmittance at the center wavelength (1550 nm) of the bandpass filter 21e is desirably as high as possible and is preferably, for example, substantially 100%.

As illustrated in FIG. 6B, the reflectance of the half mirror 21f with respect to light in the range of the wavelength 1500 to 1600 nm is substantially constant. At least the reflectance of the half mirror 21f with respect to the first optical pulse (optical pulse having a center wavelength within ±15 nm centered at 1550 nm) is at least substantially constant. The reflectance of the half mirror 21f is desirably, for example, 30 to 40%.

In the light source device 21B according to the present embodiment, an optical pulse emitted from the first end surface E1 of the semiconductor laser LD is converted into parallel light at the collimator lens 21b and then is incident on the bandpass filter 21e. Of the light incident on the bandpass filter 21e, only light of a predetermined wavelength width centered at a specified center wavelength (1550 nm) of the semiconductor laser LD is transmitted through the bandpass filter 21e and incident on the half mirror 21f.

A portion (for example, 30% of the light) of the light incident on the half mirror 21f is reflected by the half mirror 21f, and the rest (for example, 70% of the light) is transmitted through the half mirror 21f. The parallel light reflected by the half mirror 21f is transmitted through the bandpass filter 21e, then is condensed at the collimator lens 21b, and is incident on the semiconductor laser LD from the first end surface E1. The optical pulse incident on the semiconductor laser LD is reflected by the second end surface E2 of the semiconductor laser LD, and then, a portion of the optical pulse is emitted again from the first end surface E1 of the semiconductor laser LD.

The optical pulse emitted from the first end surface E1 of the semiconductor laser LD is converted into parallel light at the collimator lens 21b, then is transmitted through the bandpass filter 21e, and is incident on the half mirror 21f. A portion (for example, 30% of the light) of the light incident on the half mirror 21f is reflected by the half mirror 21f, and the rest (for example, 70% of the light) is transmitted through the half mirror 21f. The optical pulse thus reciprocates in the second resonator RS2 formed by the second end surface E2 of the semiconductor laser LD and the half mirror 21f. Consequently, the main oscillation mode (longitudinal mode) of the semiconductor laser LD is determined by the second resonator RS2, and the light source device 21B outputs the first optical pulse (optical pulse having a center wavelength within ±15 nm centered at 1550 nm).

As described above, in the present embodiment, an optical system constituted by the bandpass filter 21e and the half mirror 21f is disposed on the optical path of the optical pulse (laser light) emitted from the first end surface E1 of the semiconductor laser LD. The optical system has a reflection characteristic in which a reflectance with respect to light of a previously specified wavelength width (for example, ±15 nm) centered at a specified center wavelength (for example, 1550 nm) of the semiconductor laser LD is higher than the reflectance of the first end surface E1 of the semiconductor laser LD. The second end surface E2 of the semiconductor laser LD and the half mirror 21f constituting the aforementioned optical system form the second resonator RS2.

Consequently, the main oscillation mode (longitudinal mode) of the semiconductor laser LD is determined by the second resonator RS2, and it is thus possible to keep the center wavelength of the light source device 21B within a predetermined range easily. Also in the present embodiment, as with the first embodiment, it is possible to oscillate laser sufficiently, even when the pulse width of an optical pulse is narrow, and the driving time of the battery is not shortened.

Third Embodiment

Optical Pulse Tester, Bidirectional Module

A main part configuration of an optical pulse tester according to the present embodiment is the same configuration as the main part configuration of the optical pulse tester 1 illustrated in FIG. 1. A main part configuration of a bidirectional module included in the optical pulse tester according to the present embodiment is a configuration in which the light source devices 21 and 22 of the bidirectional module 11 illustrated in FIG. 2 are replaced with that illustrated in FIG. 7. Description of the configurations of the optical pulse tester and the bidirectional module according to the present embodiment is thus omitted.

Light Source Device

Figure 7:
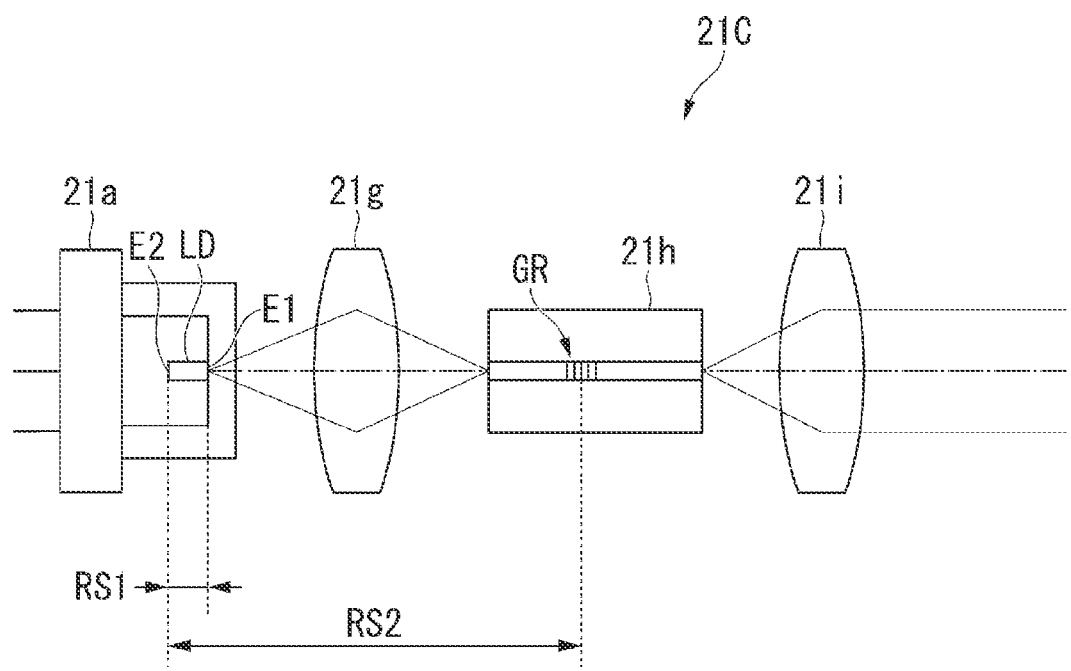
FIG. 7 is a diagram illustrating a main part configuration of a light source device according to a third embodiment of the present disclosure.

FIG. 7 is a diagram illustrating a main part configuration of a light source device according to the third embodiment of the present disclosure. In FIG. 7, a light source device 21C provided instead of the light source device 21 illustrated in FIG. 3 is illustrated. A light source device 22C (not illustrated) provided instead of the light source device 22 illustrated in FIG. 3 has the same configuration. Note that the center wavelength of the light source device 22C is 1310 nm.

As illustrated in FIG. 7, the light source device 21C according to the present embodiment differs from the light source device 21 illustrated in FIG. 3 in that, instead of the collimator lens 21b and the notch filter 21c illustrated in FIG. 3, a condenser lens 21g (condenser optical system), a reflection member 21h (optical system), and a collimator lens 21i are included. That is, the light source device 21C according to the present embodiment has a configuration in which the condenser lens 21g, the reflection member 21h, and the collimator lens 21i are disposed in this order on the optical path of the optical pulse emitted from the pulse light source 21a.

The condenser lens 21g is provided on the optical path of the optical pulse between the pulse light source 21a and the reflection member 21h and condenses the optical pulse output from the pulse light source 21a on one end portion of the reflection member 21h. The reflection member 21h is a member having the same reflection/transmission characteristics (the reflection/transmission characteristics indicated in FIG. 4) as those of the notch filter 21c illustrated in FIG. 3. The reflection member 21h is, for example, a member in which a grating GR is formed at the core of an optical fiber incorporated in a fiber stub. The collimator lens 21i collimates an optical pulse emitted from the other end portion of the reflection member 21h into parallel light. In the light source device 21C according to the present embodiment, the first end surface E1 and the second end surface E2 of the semiconductor laser LD form the first resonator RS1, and the second end surface E2 of the semiconductor laser LD and the grating GR formed at the reflection member 21h form the second resonator RS2.

In the light source device 21C according to the present embodiment, an optical pulse emitted from the first end surface E1 of the semiconductor laser LD is condensed on one end portion of the reflection member 21h by the condenser lens 21g. The condensed optical pulse propagates in the core of the optical fiber incorporated in the reflection member 21h and is incident on the grating GR formed at the core of the optical fiber. A portion of the light incident on the grating GR is reflected by the grating GR, and the rest is transmitted through the grating GR. The light transmitted through the grating GR is converted into parallel light by the collimator lens 21i and output.

The light reflected by the grating GR propagates in the opposite direction in the core of the optical fiber incorporated in the reflection member 21h, then is condensed by the condenser lens 21g, and is incident on the semiconductor laser LD from the first end surface E1. The optical pulse incident on the semiconductor laser LD is reflected by the second end surface E2 of the semiconductor laser LD, and then, a portion of the optical pulse is emitted again from the first end surface E1 of the semiconductor laser LD.

The optical pulse emitted from the first end surface E1 of the semiconductor laser LD is condensed by the condenser lens 21g, then propagates in the core of the optical fiber incorporated in the reflection member 21h, and is incident on the grating GR formed at the core of the optical fiber. A portion of the light incident on the grating GR is reflected by the grating GR, and the rest is transmitted through the grating GR. The light transmitted through the grating GR is converted into parallel light by the collimator lens 21i and output.

The optical pulse thus reciprocates in the second resonator RS2 formed by the second end surface E2 of the semiconductor laser LD and the grating GR formed at the reflection member 21h. Consequently, the main oscillation mode (longitudinal mode) of the semiconductor laser LD is determined by the second resonator RS2, and the light source device 21 outputs the first optical pulse (optical pulse having a center wavelength within ±15 nm centered at 1550 nm).

As described above, in the present embodiment, the reflection member 21h at which the grating GR is formed is disposed on the optical path of the optical pulse (laser light) emitted from the first end surface E1 of the semiconductor laser LD. The grating GR has a reflection characteristic in which a reflectance with respect to light of a previously specified wavelength width (for example, ±15 nm) centered at a specified center wavelength (for example 1550 nm) of the semiconductor laser LD is higher than the reflectance of the first end surface E1 of the semiconductor laser LD. The second end surface E2 of the semiconductor laser LD and the grating GR of the reflection member 21h form the second resonator RS2.

Consequently, the main oscillation mode (longitudinal mode) of the semiconductor laser LD is determined by the second resonator RS2, and it is thus possible to keep the center wavelength of the light source device 21C within a predetermined range easily. Also in the present embodiment, as with the first embodiment, it is possible to oscillate laser sufficiently, even when the pulse width of an optical pulse is narrow, and the driving time of the battery is not shortened.

While Light source devices and optical pulse testers according to embodiments of the present disclosure have been described above, the present invention is not limited to the aforementioned embodiments and can be changed freely within the range of the present invention. For example, in the first to third embodiments described above, an optical pulse tester including a light source device that outputs an optical pulse having a wavelength of 1550 nm and a light source device that outputs an optical pulse having a wavelength of 1310 nm has been described. However, the optical pulse tester may include only one of the light source device that outputs an optical pulse having a wavelength of 1550 nm and the light source device that outputs an optical pulse having a wavelength of 1310 nm.

In the first to third embodiments described above, an optical pulse tester that outputs an optical pulse having a wavelength of 1550 nm and an optical pulse having a wavelength of 1310 nm has been described. The wavelength of an optical pulse output from the optical pulse tester, however, may be a wavelength other than the wavelength of 1550 nm and the wavelength of 1310 nm. The optical pulse tester is not limited to an optical pulse tester that outputs optical pulses having two wavelengths, may be an optical pulse tester that outputs an optical pulse having one wavelength, and may be an optical pulse tester that outputs optical pulses having three or more wavelengths.

The light source device according to the above-described first embodiment includes the notch filter 21c having the reflection/transmission characteristics indicated in FIG. 4. However, instead of the notch filter 21c, a VHG (Volume Holographic Grating) having the same reflection/transmission characteristics may be included. Although a specific form of embodiment has been described above and illustrated in the accompanying drawings in order to be more clearly understood, the above description is made by way of example and not as limiting the scope of the invention defined by the accompanying claims. The scope of the invention is to be determined by the accompanying claims. Various modifications apparent to one of ordinary skill in the art could be made without departing from the scope of the invention. The accompanying claims cover such modifications.

What is claimed is:

1. A light source device comprising:
a semiconductor laser that has a first end surface and a second end surface parallel to each other, the first end surface and the second end surface constituting a first resonator, and the semiconductor laser being configured to emit laser light from the first end surface; and
an optical system that is disposed on an optical path of the laser light emitted from the semiconductor laser, that constitutes a second resonator with the second end surface of the semiconductor laser, and that has a reflection characteristic in which a reflectance of the optical system with respect to light of a prespecified wavelength width centered at a specified center wavelength of the semiconductor laser is higher than a reflectance of the first end surface,
wherein the first resonator is configured to cause a laser oscillation between the first end surface and the second end surface to emit the laser light from the first end surface,
wherein the first end surface has the reflectance with respect to the light of the prespecified wavelength width centered at the specified center wavelength of the semiconductor laser to cause the laser oscillation between the first end surface and the second end surface.

2. The light source device according to claim 1, wherein the optical system includes an optical element that has a first surface on which a reflection film having the reflection characteristic is provided and a second surface on which an anti-reflection film with respect to the laser light emitted from the semiconductor laser is provided.

3. The light source device according to claim 1, wherein the optical system includes:
a first optical element disposed obliquely with respect to the optical path of the laser light and having a transmission characteristic in which only light of the prespecified wavelength width centered at the specified center wavelength of the semiconductor laser is transmitted, and
a second optical element that reflects and transmits the laser light transmitted through the first optical element at a prespecified ratio.

4. The light source device according to claim 1, further comprising:
a collimator optical system that is disposed on the optical path of the laser light between the semiconductor laser and the optical system and that collimates the laser light emitted from the semiconductor laser.

5. The light source device according to claim 1, wherein the optical system includes a reflection member at which a fiber grating having the reflection characteristic is formed, and
wherein the light source device further comprises a condenser optical system that is provided on the optical path of the laser light between the semiconductor laser and the reflection member and that condenses the laser light emitted from the semiconductor laser on the reflection member.

6. An optical pulse tester configured to test a characteristic of an optical fiber based on return light obtained from the optical fiber by causing an optical pulse to be incident on the optical fiber, the optical pulse tester comprising:
a bidirectional module including:
the light source device according to claim 1 configured to emit the optical pulse, and
a light receiver configured to receive the return light; and
a signal processor configured to perform a processing that obtains the characteristic of the optical fiber based on a light reception result of the light receiver.

7. The light source device according to claim 1, wherein main oscillation mode of the semiconductor laser is determined by the second resonator.

8. The light source device according to claim 1, wherein a reflection film is provided on the second end surface.

9. The light source device according to claim 8, wherein anti-reflection film is provided on the first end surface.

10. The light source device according to claim 1, wherein the optical system is a notch filter formed by a glass material.

* * * * *